United States Patent
Hutchinson et al.

(10) Patent No.: US 8,097,870 B2
(45) Date of Patent: Jan. 17, 2012

(54) MEMORY CELL WITH ALIGNMENT STRUCTURE

(75) Inventors: Christina Laura Hutchinson, Eden Prairie, MN (US); Insik Jin, Eagan, MN (US); Lance Stover, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 295 days.

(21) Appl. No.: 12/402,748

(22) Filed: Mar. 12, 2009

(65) Prior Publication Data

US 2010/0110746 A1    May 6, 2010

Related U.S. Application Data

(60) Provisional application No. 61/111,356, filed on Nov. 5, 2008.

(51) Int. Cl.
*H01L 47/00* (2006.01)

(52) U.S. Cl. .................... 257/2; 257/4; 257/E47.001

(58) Field of Classification Search .............. 257/2, 4, 257/E47.001
See application file for complete search history.

(56) References Cited

U.S. PATENT DOCUMENTS

| | | | |
|---|---|---|---|
| 5,086,015 A | 2/1992 | Itoh et al. | |
| 5,687,112 A * | 11/1997 | Ovshinsky | 365/163 |
| 5,761,115 A | 6/1998 | Kozicki | |
| 6,423,621 B2 | 7/2002 | Doan | |
| 6,586,761 B2 * | 7/2003 | Lowrey | 257/3 |
| 6,828,678 B1 | 12/2004 | Koutny, Jr. | |
| 6,870,751 B2 | 3/2005 | Van Brocklin | |
| 7,042,001 B2 * | 5/2006 | Kim et al. | 257/3 |
| 7,057,923 B2 * | 6/2006 | Furkay et al. | 365/163 |
| 7,098,503 B1 | 8/2006 | Marsh | |
| 7,208,372 B2 | 4/2007 | Hsu | |
| 7,442,603 B2 * | 10/2008 | Lai et al. | 438/238 |
| 7,473,576 B2 * | 1/2009 | Lung | 438/102 |
| 7,488,968 B2 * | 2/2009 | Lee | 257/4 |
| 7,550,313 B2 * | 6/2009 | Arnold et al. | 438/84 |
| 7,599,217 B2 * | 10/2009 | Lai et al. | 365/163 |
| 7,638,359 B2 * | 12/2009 | Lung | 438/102 |
| 7,642,123 B2 * | 1/2010 | Lung | 438/95 |
| 7,671,353 B2 * | 3/2010 | Philipp et al. | 257/2 |
| 7,679,074 B2 * | 3/2010 | Philipp et al. | 257/2 |

(Continued)

FOREIGN PATENT DOCUMENTS

KR    2006001105    *   1/2006

OTHER PUBLICATIONS

U.S. Appl. No. 12/390,711, filed Feb. 23, 2009, Sun et al.

(Continued)

*Primary Examiner* — Mary Wilczewski
(74) *Attorney, Agent, or Firm* — Mueting Raasch & Gebhardt, PA

(57) ABSTRACT

A memory cell that includes a memory element configured for switching from a first data state to a second data state by passage of current therethrough. The memory cell includes a top electrode and a bottom electrode for providing the current through the memory cell, and an alignment element positioned at least between the top electrode and the top surface of the memory element, the alignment element having an electrically conductive body tapering from the top electrode to the top surface of the memory element. Methods for forming the memory cell are also described.

8 Claims, 7 Drawing Sheets

U.S. PATENT DOCUMENTS

| | | | |
|---|---|---|---|
| 7,692,272 B2 * | 4/2010 | Asano et al. | 257/613 |
| 7,718,989 B2 * | 5/2010 | Lai et al. | 257/2 |
| 7,772,581 B2 * | 8/2010 | Lung | 257/3 |
| 7,786,461 B2 * | 8/2010 | Lung | 257/2 |
| 7,795,068 B2 * | 9/2010 | Horak et al. | 438/95 |
| 7,812,333 B2 * | 10/2010 | Philipp et al. | 257/3 |
| 7,888,719 B2 * | 2/2011 | Shue et al. | 257/296 |
| 7,893,420 B2 * | 2/2011 | Liang et al. | 257/4 |
| 7,906,368 B2 * | 3/2011 | Breitwisch et al. | 438/102 |
| 7,910,911 B2 * | 3/2011 | Breitwisch et al. | 257/4 |
| 7,943,918 B2 * | 5/2011 | Park et al. | 257/2 |
| 2004/0109351 A1 | 6/2004 | Morimoto | |
| 2005/0180189 A1 | 8/2005 | Happ | |
| 2005/0274942 A1 | 12/2005 | Kozicki | |
| 2006/0040485 A1 * | 2/2006 | Lee et al. | 438/597 |
| 2007/0040159 A1 * | 2/2007 | Wang | 257/3 |
| 2008/0061341 A1 * | 3/2008 | Lung | 257/303 |
| 2008/0186762 A1 * | 8/2008 | Chuo et al. | 365/163 |
| 2008/0266932 A1 * | 10/2008 | Happ et al. | 365/148 |
| 2009/0001341 A1 * | 1/2009 | Breitwisch et al. | 257/4 |
| 2010/0044664 A1 * | 2/2010 | Liu | 257/2 |
| 2010/0110746 A1 * | 5/2010 | Hutchinson et al. | 365/51 |

OTHER PUBLICATIONS

U.S. Appl. No. 12/361,866, filed Jan. 29, 2009, Lou.

U.S. Appl. No. 12/263,562, filed Nov. 3, 2008, Jin et al.

* cited by examiner

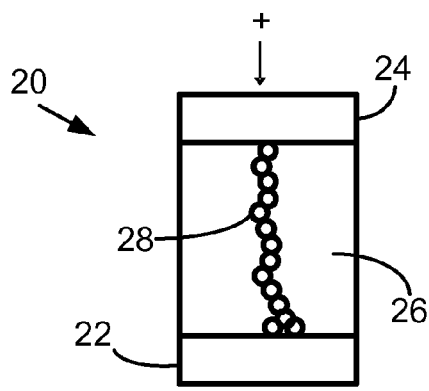
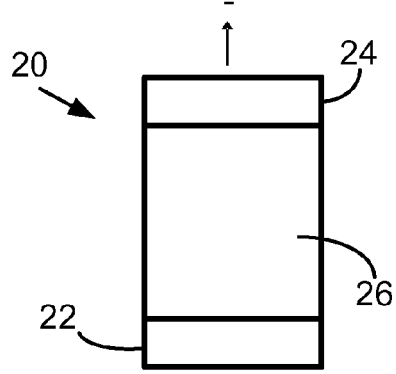
FIG. 2A  FIG. 2B
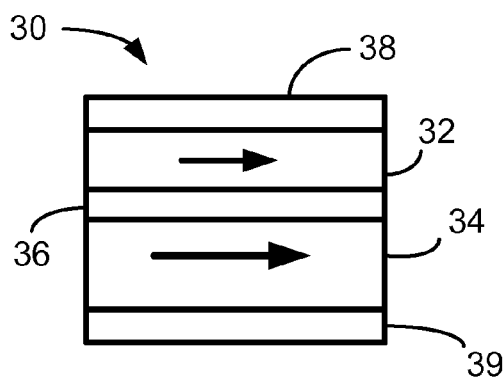
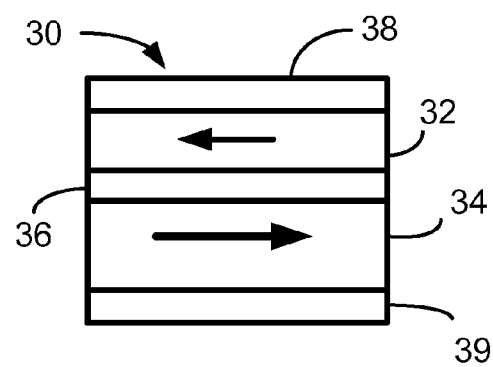
FIG. 3A  FIG. 3B
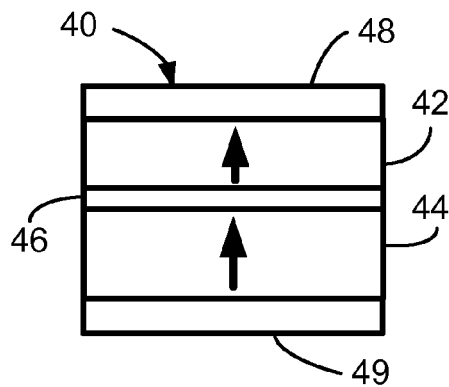
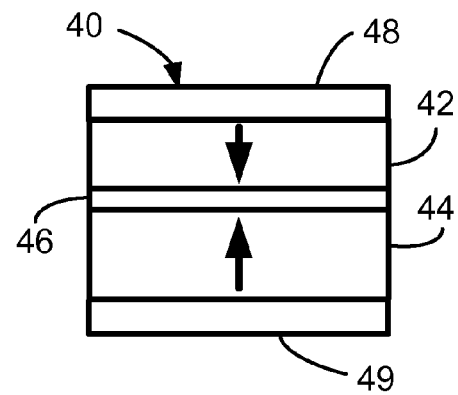
FIG. 4A  FIG. 4B

US 8,097,870 B2

MEMORY CELL WITH ALIGNMENT STRUCTURE

RELATED APPLICATIONS

This application claims priority to U.S. provisional patent application No. 61/111,356, filed on Nov. 5, 2008 and titled "Self Aligned Pointed Structure for Memory Devices". The entire disclosure of application No. 61/111,356 is incorporated herein by reference.

BACKGROUND

Memory devices are common in electronic systems and computers to store data. These memory devices may be volatile memory, where the stored data is lost if the power source is disconnected or removed, or non-volatile, where the stored data is retained even during power interruption.

Many memory devices, such as magnetic memory and resistive memory elements, are very small. At least because of their small size, it is desirous to use these memory devices in many applications. One of the issues associated with both magnetic memory and resistive memory is the current switching ability for each of the multitude of memory cells and the distribution or density of the switching currents. One possible reason for inaccurate switching ability and distribution is non-uniform current density through the cell. Another possible problem is excessive heat generation caused by the use of currents with high amplitude to switch the data state of the memory cells. Among other things, this temperature increase reduces the stability of the memory elements. Another problem is a relatively long typical switching time (e.g., many nanoseconds) of such elements.

In some memory designs, a reduction in the size of the memory cell can reduce the needed switching current. However, there are major difficulties in implementing smaller sizes due to at least current limitations of fabrication methods like photolithographic patterning. It is desirable to reduce the switching current density in order to make a feasible memory device.

BRIEF SUMMARY

The present disclosure relates to memory cell having a current alignment structure with a memory element, the current alignment structure configured to reduce the switching current needed to switch the memory element state. Methods of forming the memory cells are also provided.

In one illustrative embodiment, the memory cell includes a memory element configured for switching from a first data state to a second data state by passage of current therethrough, the memory element having a top surface and a bottom surface. The memory cell includes a top electrode and a bottom electrode for providing the current through the memory element, and an alignment element positioned at least between the top electrode and the top surface of the memory element, the alignment element having an electrically conductive body tapering from the top electrode to the top surface of the memory element. In some embodiments, the alignment element comprises a first alignment portion positioned between the top electrode and the top surface of the memory element, the first alignment portion having an electrically conductive body tapering from the top electrode to the top surface of the memory element, and a second alignment portion positioned between the bottom electrode and the bottom surface of the memory element, the second alignment portion having an electrically conductive body tapering from the bottom electrode to the bottom surface of the memory element.

One illustrative method of forming a memory cell includes providing a bottom electrode and forming a multilayer on the bottom electrode, the multilayer comprising a memory layer and at least one electrically conducting layer. Then, applying a hard mask layer on the multilayer and patterning the multilayer and hard mask layer to form a columnar structure. The columnar structure is milled via high angle ion beam etch to provide a tapered structure having a narrowest portion at the memory layer, and a top electrode is formed on the tapered structure.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which:

FIG. 2A is a schematic side view diagram of an illustrative programmable metallization memory cell in a low resistance state; FIG. 2B is schematic side view diagram of the illustrative programmable metallization memory cell in a high resistance state;

FIG. 3A is a side view diagram of an illustrative magnetic tunnel junction memory cell with in-plane magnetization orientation in a low resistance state; FIG. 3B is schematic side view diagram of the illustrative magnetic tunnel junction memory cell in a high resistance state;

FIG. 4A is a side view diagram of an illustrative magnetic tunnel junction memory cell with out-of-plane magnetization orientation in a low resistance state; FIG. 4B is schematic side view diagram of the illustrative magnetic tunnel junction memory cell in a high resistance state;

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1A:
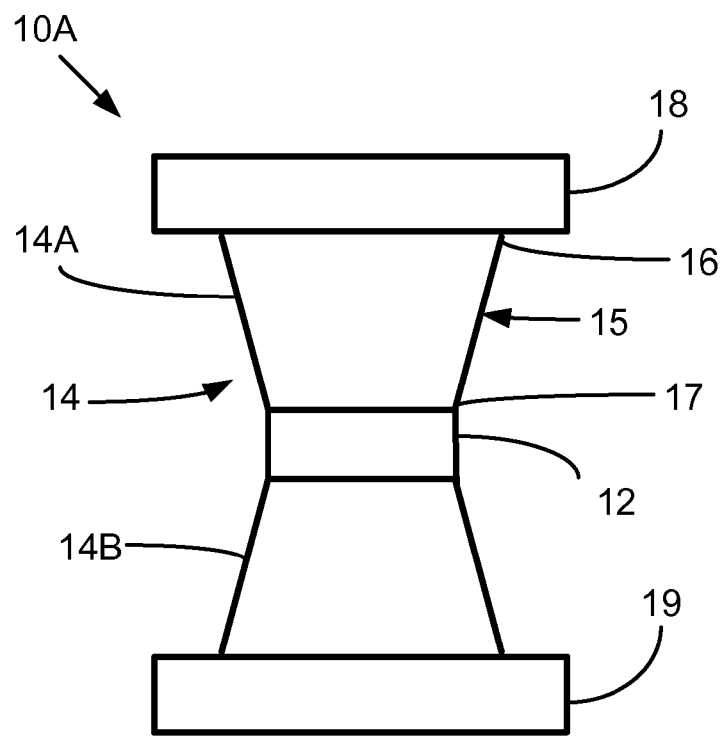
FIGS. 1A and 1B are schematic side view diagrams of memory cells having a memory element and an alignment structure.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. Any definitions provided herein are to facilitate understanding of certain terms used herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to memory elements having a memory cell and methods of reducing the switching current needed by increasing the density of the current through the memory cell. The present disclosure also relates to memory elements where the distribution of current density is controlled. The memory element includes a memory cell and an alignment element that, in some embodiments, focuses the current prior to passing through the memory cell. The alignment element also controls the distribution of the current density through the memory cell. The structure and methods of this disclosure can be used with any memory cell, including multi-bit cells, that utilizes a current to switch the data state of the memory cell, e.g., from a "0" state to a "1" state, "00" state to "11" state, etc. Examples of memory cells include spin torque memory (ST RAM), resistive memory (RRAM), ferroelectric memory (FeRAM) and phase change memory (PC RAM), among others.

The alignment element allows the critical dimension (CD) of the memory element to be reduced to dimensions less than photolithographic capabilities. Typical photolithography patterning techniques limit the size of the memory device to greater than about 50 nm. With an alignment element of this disclosure, the critical dimension of the memory element can be as small as 10 nm. Minimizing the dimension of a memory element is desirable because it correlates with reducing the switching current. In addition, in the case of RRAM, very small CDs have been proposed as an attempt to reduce the number of filaments formed and thereby reducing not only the switching current, but also enabling a more uniform current distribution across the memory element and across the entire memory array.

FIG. 1A illustrates a memory cell 10A having a memory element 12 and an electrically conducting alignment element 14. In this embodiment, alignment element 14 is composed of a top or first portion 14A and, in this embodiment, a bottom or second portion 14B, with memory element 12 therebetween. A top or first electrode 18 is in electrical contact with first portion 14A and a bottom or second electrode 19 is in electrical contact with second portion 14B. Electrodes 18, 19 electrically connect alignment element 14 and memory element 12 to a control circuit providing read and write currents through element 12.

Figure 1B:
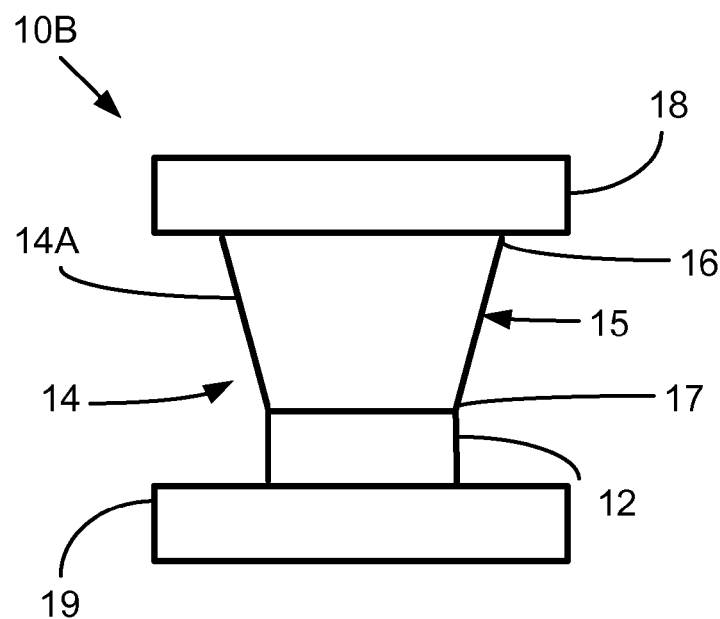

FIG. 1B illustrates a memory cell 10B having a memory element 12 and an electrically conducting alignment element 14. In this embodiment, alignment element 14 is composed of a top or first portion 14A. A top or first electrode 18 is in electrical contact with first portion 14A and a bottom or second electrode 19 is in electrical contact with memory element 12. Electrodes 18, 19 electrically connect alignment element 14 and memory element 12 to a control circuit providing read and write currents through element 12.

Alignment element 14 has a body 15 that tapers or narrows as it approaches memory element 12. The widest area of alignment element 14 is proximate its adjacent electrode. Portion 14A of alignment element 14 has a first end 16 proximate electrode 18 and a second end 17 proximate memory element 12. In some embodiments, there are no intervening layers between alignment element 14 and memory element 12 and between portion 14A, 14B (if present) and electrodes 18, 19, respectively. Second end 17 has a smaller dimension (e.g., width, diameter, etc.) than first end 16. In the embodiment of FIG. 1A, portion 14B of alignment element 14 is the same as portion 14A, so that alignment element 14 is symmetrical around memory element 12.

Alignment element 14 is formed of an electrically conductive material, for example, Cu, Al, W, Ta, Cr, and various combinations and alloys thereof. Each portion 14A, 14B may be, for example, about 20 to 900 nm thick (e.g., about 25-250 nm thick, e.g., about 90-125 nm thick), with a width or diameter, at its widest end, less than about 130 nm (e.g., about 90-100 nm), although in some embodiments the width may be greater. Memory element 12 often has a thickness of about 10-50 nm, although thicker and thinner memory elements could be used. Because of the method of making memory cell 10, which is described below, the width or diameter or memory element 12 can be greatly less than currently possible with photolithography methods. In some embodiments, memory element 12 has a width or diameter less than 50 nm, in other embodiments, less than 20 nm. Depending on the materials of memory element 12, alignment element 14 and on the manufacturing process, memory element 12 may have a width or diameter of as small as 10 nm or less. FIGS. 2A and 2B, FIGS. 3A and 3B, and FIGS. 4A and 4B illustrate three memory elements with which an alignment element could be utilized to form a memory cell.

It is noted that terms such as "top", "bottom", "above", "below", etc. may be used in this disclosure. These terms should not be construed as limiting the position or orientation of a structure, but should be used as providing spatial relationship between the structures.

FIGS. 2A and 2B are cross-sectional schematic diagrams of an illustrative programmable metallization memory cell 20; in FIG. 2A, memory cell 20 is in the low resistance state and in FIG. 2B, memory cell 20 is in the high resistance state. Programmable metallization cell (PMC) memory is based on the physical re-location of superionic regions within an ion conductor solid electrolyte material 26. Memory cell 20 includes a first metal contact or electrode 22, a second metal contact or electrode 24, and an ion conductor solid electrolyte material 26 therebetween.

First metal contact 22 and second metal contact 24 can be formed of any useful metallic material. In many embodiments, one or both of first metal contact 22 and second metal contact 24 are formed of electrically conductive yet electrochemically inert metals such as, for example, platinum, gold, and the like. In some embodiments, first metal contact 22 and/or second metal contact 24 have two or more metal layers, where the metal layer closest to ion conductor solid electrolyte material 26 is electrochemically inert while additional layers can be electrochemically active.

Ion conductor solid electrolyte material 26 can be formed of any useful material that provides for the formation of conducting filaments 28 or superionic clusters within ion conductor solid electrolyte material 26 that extend between metal contact 22 and metal contact 24 upon application of an electric current. In some embodiments, ion conductor solid electrolyte material 26 is a chalcogenide-type material such as, for example, $GeS_2$, $GeSe_2$, $CuS_2$, and the like. In other embodiments, ion conductor solid electrolyte material 26 is an oxide-type material such as, for example, NiO, WO$_3$, SiO$_2$, and the like.

In FIG. 2A, application of an electric current (+) to second metal contact 24 allows cations from metal contact 24 to migrate toward first metal contact 22, forming conducting filaments 28 or superionic clusters within ion conductor solid electrolyte material 26. The presence of conducting filaments 28 or superionic clusters within ion conductor solid electrolyte material 26 reduces the electrical resistance between first metal contact 22 and second metal contact 24 and gives rise to the low resistance state of programmable metallization memory cell 20.

Reading memory cell 20 simply requires a small voltage applied across the cell. If conducting filaments 28 are present in that cell, the resistance will be low, which can be read, for example, as a "1". If there are no conducting filaments 28 present, the resistance is higher, which can be read as the opposite state, a "0", as illustrated in FIG. 2B. In other embodiments, the low resistance state may be "0" and the high resistance state "1". Application of an electric current of opposite polarity (−) to memory cell 20 ionizes conducting filaments 28 and moves the ions back to second metal contact 24 and gives rise to the high resistance state of memory cell 20. The low resistance state and the high resistance state are switchable with an applied electric field and are used to store the memory bit "1" or "0".

FIGS. 3A and 3B are cross-sectional schematic diagrams of an illustrative magnetic tunnel junction memory cell 30 that includes a relatively soft ferromagnetic free layer 32 and a ferromagnetic reference (i.e., fixed or pinned) layer 34. Ferromagnetic free layer 32 and ferromagnetic pinned layer 34 are separated by an oxide barrier layer 36 or non-magnetic tunnel barrier. Other layers, such as seed or capping layers, are not depicted for clarity. Free layer 32 and pinned layer 34 each have an associated magnetization orientation; the magnetization orientation of free layer 32 being more readily switchable than the magnetization orientation of pinned layer 34. In the illustrated embodiment, free layer 32 is above pinned layer 34; in other embodiments, pinned layer 34 may be above free layer 32.

Ferromagnetic layers 32, 34 may be made of any useful ferromagnetic (FM) material such as, for example, Fe, Co or Ni and alloys thereof, such as NiFe and CoFe. Ternary alloys, such as CoFeB, may be particularly useful because of their lower moment and high polarization ratio. Either or both of free layer 32 and pinned layer 34 may be either a single layer or an unbalanced synthetic antiferromagnetic (SAF) coupled structure, i.e., two ferromagnetic sublayers separated by a metallic spacer, such as Ru or Cu, with the magnetization orientations of the sublayers in opposite directions to provide a net magnetization. Barrier layer 36 may be made of an electrically insulating material such as, for example an oxide material (e.g., Al$_2$O$_3$, TiO$_x$ or MgO). Barrier layer 36 could optionally be patterned with free layer 32 or with pinned layer 34, depending on process feasibility and device reliability.

A first electrode 38 is in electrical contact with ferromagnetic free layer 32 and a second electrode 39 is in electrical contact with ferromagnetic pinned layer 34. Electrodes 38, 39 electrically connect ferromagnetic layers 32, 34 to a control circuit providing read and write currents through layers 32, 34. The resistance across magnetic tunnel junction memory cell 30 is determined by the relative orientation of the magnetization vectors or magnetization orientations of ferromagnetic layers 32, 34. The magnetization direction of ferromagnetic pinned layer 34 is pinned in a predetermined direction while the magnetization direction of ferromagnetic free layer 32 is free to rotate under the influence of spin torque. Pinning of ferromagnetic pinned layer 34 may be achieved through, e.g., the use of exchange bias with an antiferromagnetically ordered material (AFM) such as PtMn, IrMn, and others.

In FIG. 3A, magnetic tunnel junction memory cell 30 is in the low resistance state where the magnetization orientation of free layer 32 is parallel and in the same direction as the magnetization orientation of pinned layer 34. This is termed the low resistance state. In FIG. 3B, magnetic tunnel junction memory cell 30 is in the high resistance state where the magnetization orientation of free layer 32 is anti-parallel and in the opposite direction of the magnetization orientation of pinned layer 34. This is termed the high resistance state.

Switching the resistance state and hence the data state of magnetic tunnel junction memory cell 30 via spin-transfer occurs when a current, passing through a magnetic layer of magnetic tunnel junction memory cell 30, becomes spin polarized and imparts a spin torque on free layer 32 of magnetic tunnel junction memory cell 30. When a sufficient spin torque is applied to free layer 32, the magnetization orientation of free layer 32 can be switched between two opposite directions and accordingly, magnetic tunnel junction memory cell 30 can be switched between the parallel state (i.e., low resistance state) and anti-parallel state (i.e., high resistance state). In some embodiments, the low resistance state may be "0" and the high resistance state "1", whereas in other embodiments, the low resistance state may be "1" and the high resistance state "0". Each layer 32, 34 acts as a "spin filter" when cell 30 writes with "0" or "1" as the switching current passes through in opposite directions to alter magnetization of free layer 32.

For magnetic tunnel junction memory cell 30, the magnetization orientations of free layer 32 and pinned layer 34 are in the plane of the layers, or in-plane. FIGS. 4A and 4B illustrate an alternate embodiment of a magnetic tunnel junction memory cell that has the magnetization orientations of the free layer and the pinned layer perpendicular to the plane of the layers, or out-of-plane.

Similar to magnetic tunnel junction memory cell 30 of FIGS. 3A and 3B, magnetic tunnel junction memory cell 40 of FIGS. 4A and 4B has relatively soft ferromagnetic free layer 42 and a ferromagnetic reference (i.e., fixed or pinned) layer 44 separated by an oxide barrier layer 46 or non-magnetic tunnel barrier. Pinned layer 44 can be a single layer with large coercivity or a layer pinned by a pinning layer, or a synthetic antiferromagnetic (SAF) trilayer, or a SAF pinned by a pinning layer. A first electrode 48 is in electrical contact with free layer 42 and a second electrode 49 is in electrical contact with pinned layer 44. Other layers, such as seed or capping layers, are not depicted for clarity. In the illustrated embodiment, free layer 42 is above pinned layer 44; in other embodiments, pinned layer 44 may be above free layer 42. Electrodes 48, 49 electrically connect layers 42, 44 to a control circuit providing read and write currents through layers 42, 44. The various elements of cell 40 are similar to the element of cell 30, described above, except that the magnetization orientations of layers 42, 44 are oriented perpendicular to the layer extension rather than in the layer plane.

Free layer 42 and pinned layer 44 each have a magnetization orientation associated therewith. In FIG. 4A, magnetic tunnel junction memory cell 40 is in the low resistance state where the magnetization orientation of free layer 42 is in the same direction as the magnetization orientation of pinned layer 44. In FIG. 4B, magnetic tunnel junction memory cell 40 is in the high resistance state where the magnetization orientation of free layer 42 is in the opposite direction of the magnetization orientation of pinned layer 44.

Similar to cell 30 of FIGS. 3A and 3B, switching the resistance state and hence the data state of magnetic tunnel junction memory cell 40 via spin-transfer occurs when a current, passing through a magnetic layer of magnetic tunnel junction memory cell 40, becomes spin polarized and imparts a spin torque on free layer 42. When a sufficient spin torque is applied to free layer 42, the magnetization orientation of free layer 42 can be switched between two opposite directions and accordingly, magnetic tunnel junction memory cell 40 can be switched between the low resistance state and the high resistance state.

Other memory cells may additionally or alternately be used with the alignment element to focus the current and thus reduce the switching current for the memory cell.

Figure 5:
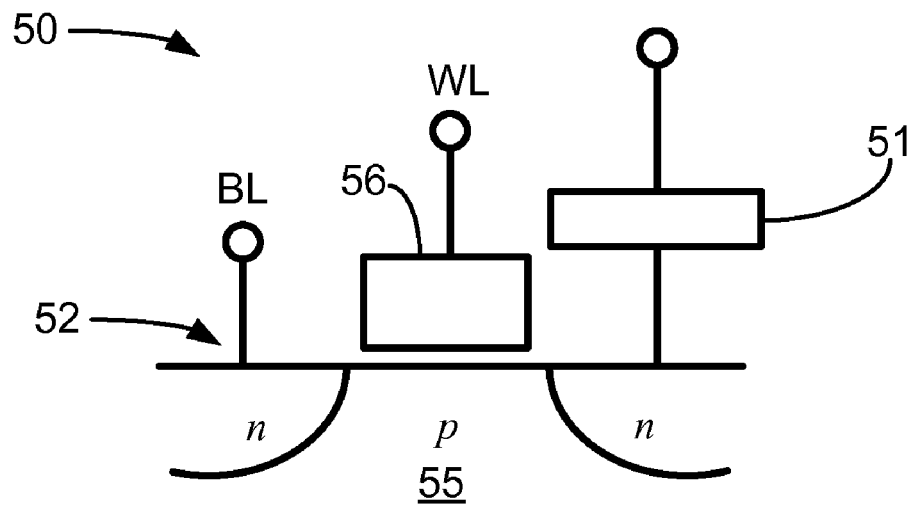
FIG. 5 is a schematic diagram of an illustrative memory unit including a memory cell and a semiconductor transistor.

FIG. 5 is a schematic diagram of an illustrative memory unit 50 including a memory cell 51 electrically coupled to a semiconductor transistor 52 via an electrically conducting element. Memory cell 51 may be any of the memory cells described herein, or may be any other memory cell configured for switching data states via a current passed through memory cell 51. Transistor 52 includes a semiconductor substrate 55 having doped regions (e.g., illustrated as n-doped regions) and a channel region (e.g., illustrated as a p-doped channel region) between the doped regions. Transistor 52 includes a gate 56 that is electrically coupled to a word line WL to allow selection and current to flow from a bit line BL to memory element 51. An array of programmable metallization memory units 50 can be formed on a semiconductor substrate utilizing semiconductor fabrication techniques.

Figure 6:
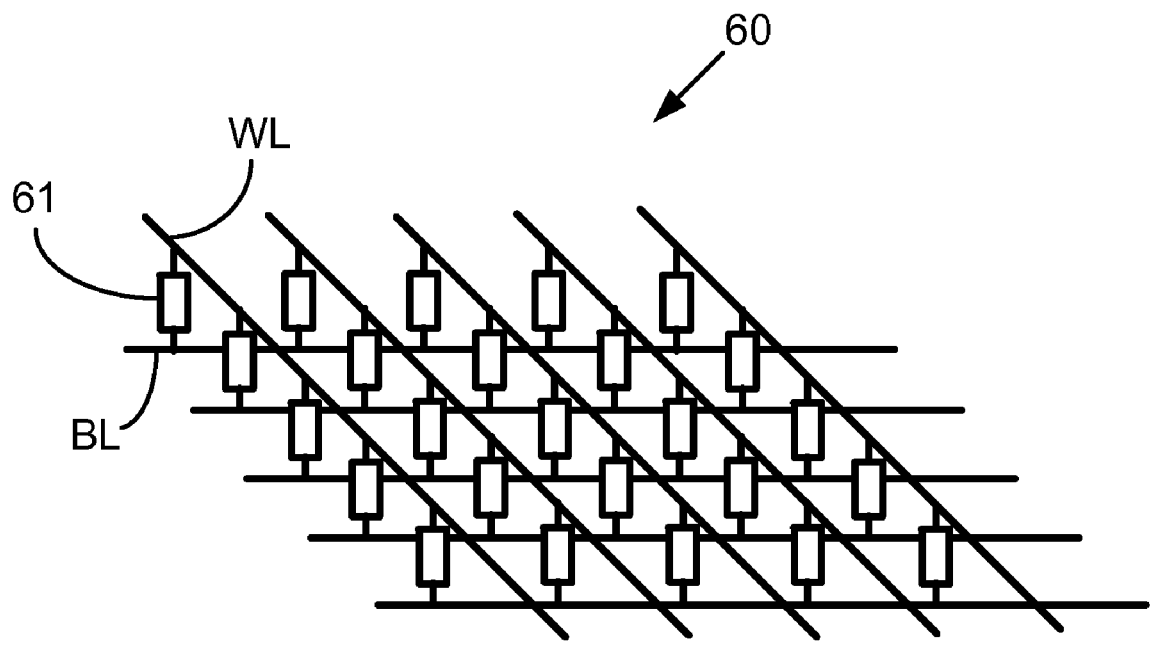
FIG. 6 is a schematic diagram of an illustrative memory array.

FIG. 6 is a schematic diagram of an illustrative memory array 60. Memory array 60 includes a plurality of word lines WL and a plurality of bit lines BL forming a cross-point array. At each cross-point a memory cell 61, as described herein, is electrically coupled to word line WL and bit line BL.

The magnetic cells of this disclosure include an alignment element that focuses the current passing therethrough, thus allowing for reduced switching current. The methods for forming magnetic cells of this disclosure allow for minimization of the CD of the memory element, which is located proximate (e.g., near or at) a tip of the pointed alignment element. The alignment element can be formed by utilizing a high angle etch process in conjunction with conductive layers that etch faster or slower. Using this technique, the pointing feature of the alignment element is self-aligned, such that two portions of alignment element (when present) (e.g., portion 14A and portion 14B of element 14 of FIG. 1A) are aligned, with the memory element positioned between the two portions. The wall angle of the tapered alignment element is controlled not only by the mill angle of the etch process, but by the milling selectivity between a hard mask and the conductive layers of the element. For example, higher selectivity can yield steeper angles. The CD is determined by the wall angle and the deposition thickness of the conductive layers. FIGS. 7A-7I illustrate a method for forming a plurality of memory cells having alignment elements with a memory element.

Figure 7A:
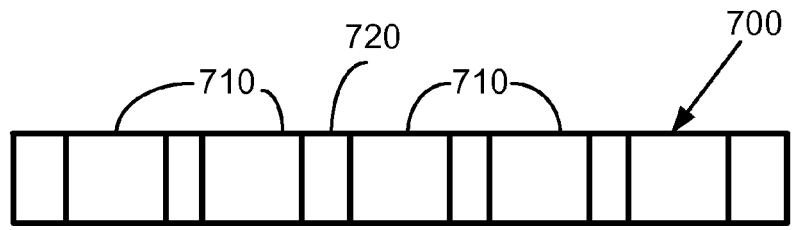
FIGS. 7A-7I are schematic side view diagrams of a stepwise method of making a plurality of memory cells.

In FIG. 7A, a plurality of bottom electrodes are patterned and planarized. A substrate 700 is provided with a plurality of electrodes 720 alternating with non-conductive material 710 (e.g., insulating material). In some embodiments, substrate 700 is a wafer (e.g., an Si or SiO₂ wafer) and non-conductive material 720 are exposed areas of substrate 700.

Figure 7B:
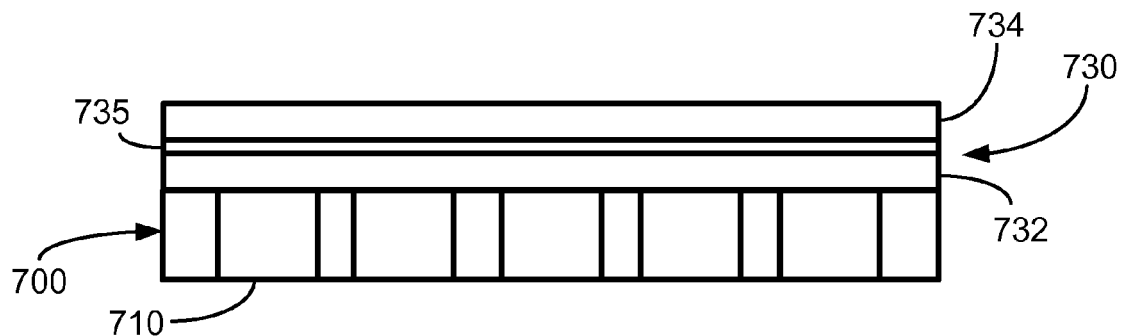

In FIG. 7B, a trilayer 730 of material is deposited over substrate 700 and bottom electrodes 710. Trilayer 730, in this embodiment, is a symmetric stack of electrically conductive material layer 732 and layer 734 around a memory layer 735. In this embodiment, layer 732 is proximate to and optionally adjacent substrate 700 and electrodes 710 with no intervening layers.

Examples of suitable materials for conductive material layers 732, 734 include Cu, Al, W, Ta, and Cr. Layers 732, 734 may be, for example, about 90 to 900 nm thick, although thinner and thicker layers 732, 734 may be suitable, depending on the material of layers 732, 734 and the desired size of the resulting memory element.

Memory layer 735 may be any memory cell material configured for switching via current. Various examples of memory cell materials have been provided above in FIGS. 2A and 2B, FIGS. 3A and 3B, and FIGS. 4A and 4B; alternate memory cell materials could also be used in memory layer 735. Memory layer 735 may be, for example, about 10-50 nm thick.

Figure 7C:
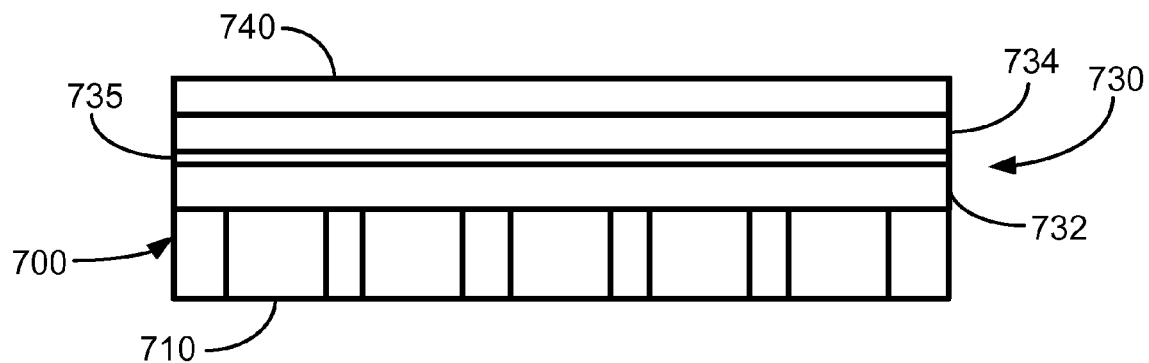

In FIG. 7C, a hard mask 740 is deposited over trilayer 730 opposite substrate 700. The material selected for hard mask 740 affects the later etching rate of trilayer 730 and also affects the later polishing step. Examples of hard mask materials include metallic materials (e.g., Ta, W, Ti, TaN, TiN) and non-metallic materials (e.g., C, DLC (i.e., diamond-like-carbon)). Hard mask 740 may be about 40-200 nm thick, depending on its material.

Figure 7D:
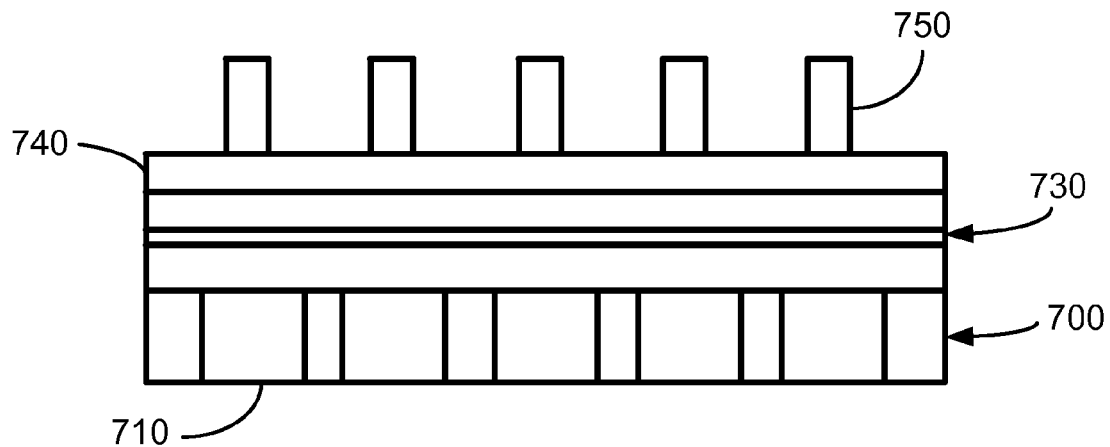
Figure 7E:
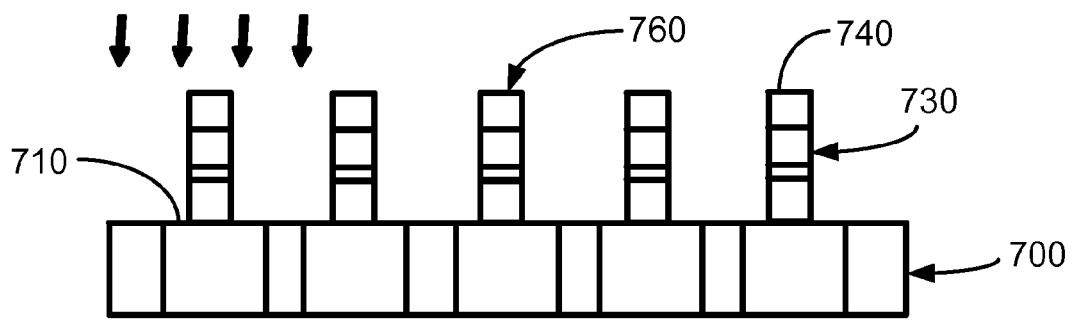

Trilayer 730 with hard mask 740 is circle patterned in FIG. 7D, utilizing photoresist 750 over hardmask 740. From FIG. 7D to FIG. 7E, the patterning process is a positive tone process, where exposed material is removed and masked material remains. The patterning process could alternately be a negative tone process, where the masked material is removed and the exposed material remains. Then, with a vertical etching process (e.g., either a milling etch or a chemical etch), structures 760 are formed. The resulting structures 760 are generally columnar (i.e., with a generally circular, oval or elliptical cross-section). In some embodiments, columnar structures 60 have a diameter of about 90-100 nm and an aspect ratio (height:width) of about 2:1 to about 10:1.

Figure 7F:
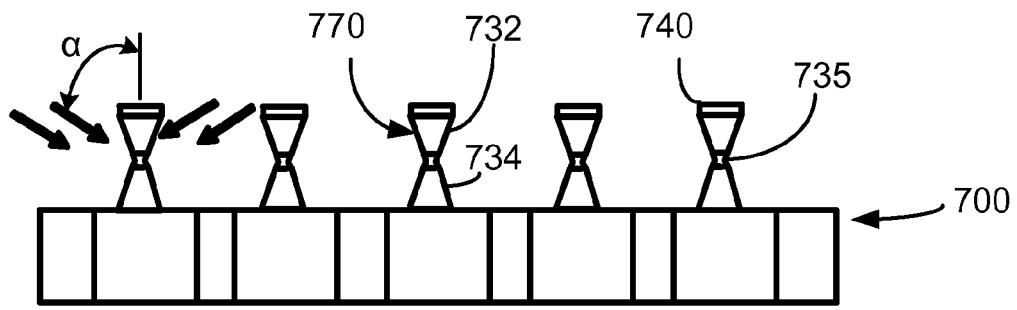

A rotational, high angle ion beam etch (IBE) is performed on structures 760 in FIG. 7F. In some embodiments, this high angle IBE is a milling process. Examples of suitable milling ions and atoms include Ar, $CHF_3$, Xe, and $CO_2$. The high angle IBE is done at an angle α in respect to perpendicular or orthogonal to substrate 700, with either the construction being milled (i.e., substrate 700 with structures 760) or the milling apparatus is rotated in a continuous 360 degrees. The angle α is typically about 2 to 60 degrees, although higher and lower angles could be suitable. In some embodiments, the angle α is between about 5 and 45 degrees, for example, about 10-30 degrees or about 30 degrees. 'Clean-up' milling may be done at much higher angles, such as up to about 80 degrees. When the milling rate of hard mask 740 is less than that of conductive layer 734, a tapered element 770 is formed. Tapered element 770 is tapered at an angle similar to, although not necessarily the same as, the mill angle α.

The resulting tapered element 770 has hard mask layer 740 that has reduced in thickness as compared to it thickness in column structure 760, although the diameter of hard mask 740 is generally the same as it was in structure 760. Trilayer 730, however, has a symmetric tapered structure, rather than the columnar form of structure 760. Each of conductive layers 732, 734 has a tapered shape, reducing in diameter from hard mask 740 to memory layer 735 for layer 732, and reducing in diameter from electrode 710 to memory layer 735 for layer 734. Each of layer 732, 734 have a large-end (e.g., first end 16 of portion 14A of memory cell 10A of FIG. 1A) that is generally unchanged in diameter from the diameter of columnar structure 760. In some embodiments, however, the tapered element may not be by symmetric around the memory layer. For example, one of the conductive layers on either side of the memory layer may have a minimum diameter between its two ends.

Memory layer 735 in tapered element 770, however, has the minimum diameter of tapered element 770 and is greatly reduced in diameter from its initial size in columnar structure 760. In some embodiments, memory layer 735 is about 10-20% of the diameter of columnar structure 760, for example, about 10-20 nm. Memory layer 735, depending on its physical construction, may have a constant diameter or may be itself tapered inward.

Figure 7G:
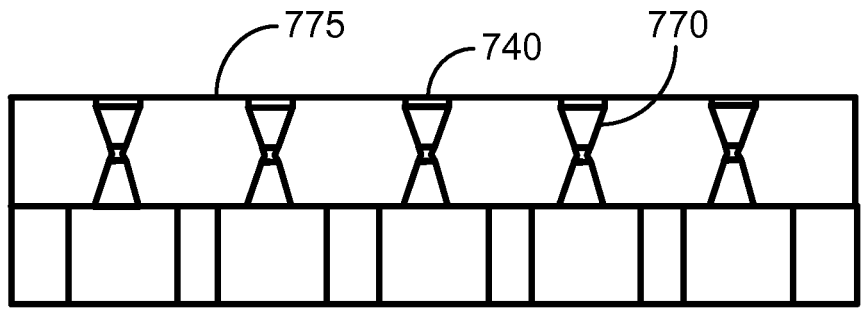
Figure 7H:
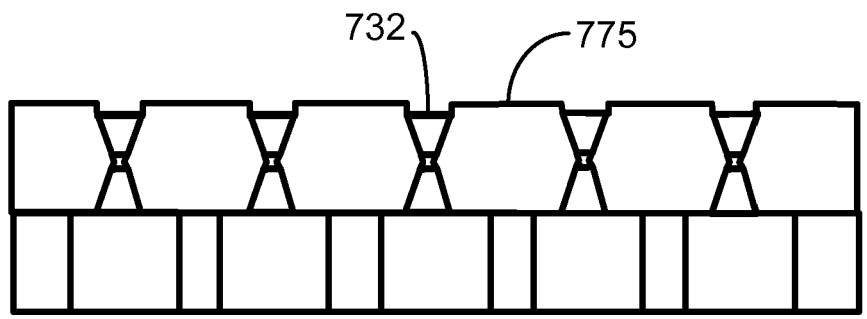
Figure 7I:
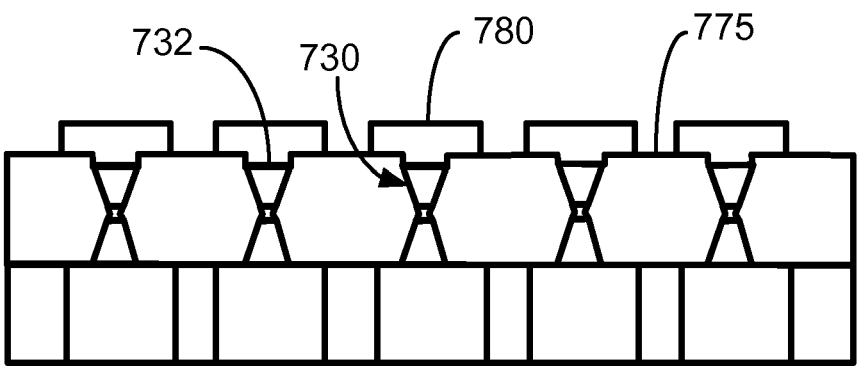

The resulting tapered elements 770 may be backfilled with a non-conductive or insulative material 775 (e.g., an oxide) and polished (e.g., planarized) to be level with hard mask 740, as in FIG. 7G. In FIG. 7H, hard mask 740 may be removed (e.g., etched) exposing layer 732 and a top electrode 780 is applied onto conductive layer 732 of trilayer 730 in FIG. 7I. In some embodiments, hard mask 740 is not removed but rather, top electrode 780 is applied onto hard mask 740.

Figure 8:
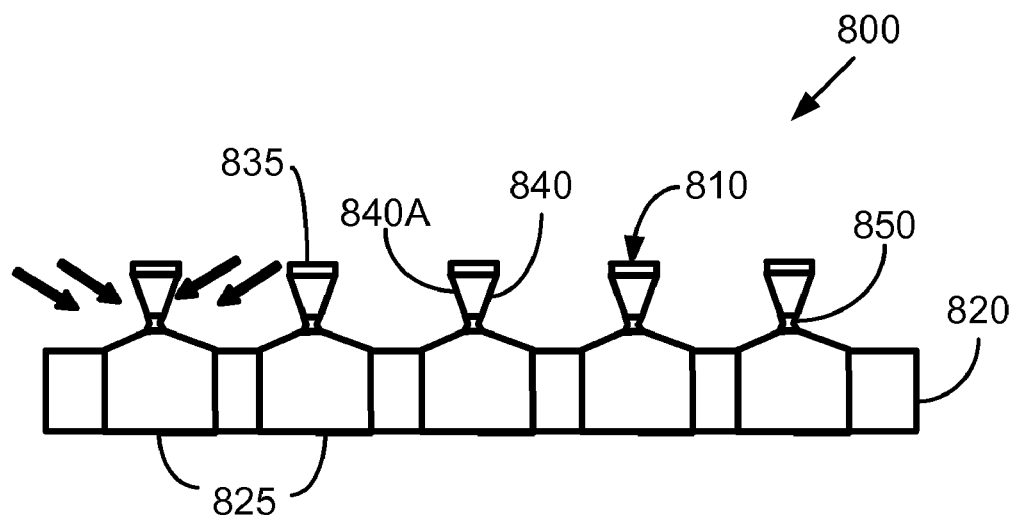
FIG. 8 is a schematic side view of an alternate embodiment of a plurality of memory cells.
Figure 9:
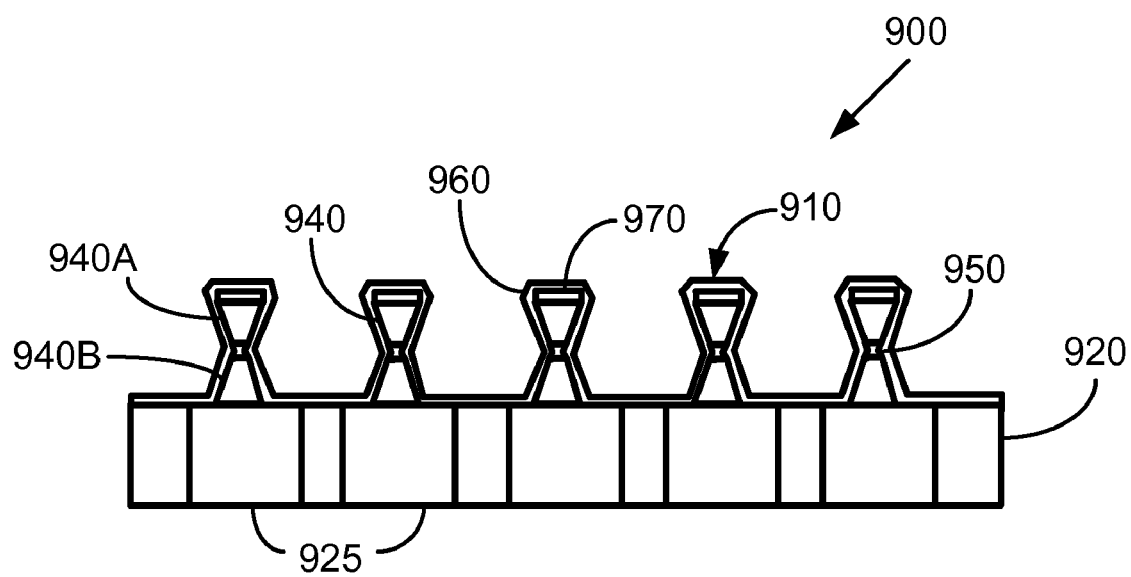
FIG. 9 is a schematic side view of a yet another embodiment of a plurality of memory cells.

FIGS. 7A-I have provided a general method for manufacturing a memory cell that includes an alignment element for focusing current through a memory element. FIGS. 8 and 9 provide alternate embodiments of memory cells that include an alignment element.

In FIG. 8, memory array 800 has a plurality of memory cells 810 on a substrate 820 having a bottom electrode 825 for each memory cell 810. A top electrode 835 is opposite from bottom electrode 825. Memory cell 810 has an alignment element 840 for focusing current into memory element 850, however in this embodiment, memory cell 810 has alignment element 840 that has only one tapered portion 840A. Specifically, alignment element 840 is positioned between and tapers from top electrode 835 to memory element 850. Memory element 850 is positioned proximate bottom electrode 825, with possible intervening layers, but with no alignment element 840 therebetween.

Memory cells 810 would be made in a manner similar to that described with respect to FIGS. 7A-7I, except that a bilayer (rather than trilayer 730) would be used, with the bilayer having a memory element layer (for memory element 850) and one conductive layer (for tapered portion 840A).

In FIG. 9, a memory array 900 has a plurality of memory cells 910 on a substrate 920 having a bottom electrode 925 for each memory cells 910. Memory cell 910 has an alignment element 940 having first portion 940A and second portion 940B for focusing current into memory element 950. Extending continuously over substrate 920 and memory elements 910 is a thin conformal layer 960 (e.g., an oxide). Layer 960 may improve structural stability of memory cells 910. Layer 960 may be applied, for example, by atomic layer deposition (ALD), immediately after the rotational, high angle ion beam etch (IBE) that forms the tapered structures. Layer 960 would be removed by the subsequent polishing process along the top of hard mask 970 or alignment element first portion 940A, providing electrical contact to memory element 950. A hard mask 970 is positioned between first portion 940 of alignment element 940 and conformal layer 960.

Thus, embodiments of the MEMORY CELL WITH ALIGNMENT STRUCTURE are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A memory cell comprising:
   a memory element configured for switching between various data states by passage of current therethrough, the memory element having a top surface and a bottom surface;
   a top electrode and a bottom electrode for providing the current through the memory element; and
   an alignment element positioned at least between the top electrode and the top surface of the memory element, the alignment element having an electrically conductive body tapering from the top electrode to the top surface of the memory element,
   wherein the alignment element comprises:
      a first alignment portion positioned between the top electrode and the top surface of the memory element, the first alignment portion having an electrically conductive body tapering from the top electrode to the top surface of the memory element; and
      a second alignment portion positioned between the bottom electrode and the bottom surface of the memory element, the second alignment portion having an electrically conductive body tapering from the bottom electrode to the bottom surface of the memory element.

2. The memory cell of claim 1, wherein the first alignment portion, memory cell and second alignment portion, combined, have a height and a width, with a ratio of the height to width being about 2:1 to about 10:1.

3. The memory cell of claim 1 wherein the first alignment portion and the second alignment portion are symmetrical around the memory cell.

4. The memory cell of claim 1 wherein the memory element has a width that is 10-20% of a maximum width of the alignment structure.

5. The memory cell of claim 1 further comprising a conformal oxide layer coating at least a portion of the memory element, the bottom electrode and the alignment element.

6. The memory cell of claim 1 wherein the memory element has a diameter of about 20 nm or less.

7. The memory cell of claim 6 wherein the memory element has a diameter of about 10 nm or less.

8. The memory cell of claim 1 wherein the alignment element comprises Cu, Al, W, Ta, or Cr.

* * * * *